(12) United States Patent
Kim et al.

(10) Patent No.: US 10,816,839 B2
(45) Date of Patent: Oct. 27, 2020

(54) DISPLAY DEVICE AND MANUFACTURING METHOD THEREOF

(71) Applicant: LG ELECTRONICS INC., Seoul (KR)

(72) Inventors: Kyoungtae Kim, Seoul (KR); Hyungu Kim, Seoul (KR); Sanghun Baek, Seoul (KR); Jeoungoun Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 54 days.

(21) Appl. No.: 15/779,972

(22) PCT Filed: Nov. 14, 2017

(86) PCT No.: PCT/KR2017/012835
§ 371 (c)(1),
(2) Date: May 30, 2018

(87) PCT Pub. No.: WO2018/088868
PCT Pub. Date: May 17, 2018

(65) Prior Publication Data
US 2018/0364515 A1 Dec. 20, 2018

(30) Foreign Application Priority Data

Nov. 14, 2016 (KR) .................. 10-2016-0150921

(51) Int. Cl.
*G02F 1/1333* (2006.01)
*G02B 6/42* (2006.01)
(Continued)

(52) U.S. Cl.
CPC ....... *G02F 1/133308* (2013.01); *G02B 6/428* (2013.01); *G02F 1/13452* (2013.01);
(Continued)

(58) Field of Classification Search
None
See application file for complete search history.

(56) References Cited

U.S. PATENT DOCUMENTS 8,654,273 B2 * 2/2014 Hong ................ G02F 1/133308
349/58
2009/0080148 A1 3/2009 Sugawara
(Continued)

FOREIGN PATENT DOCUMENTS

GB 2535012 A 8/2016
JP 2009-162922 A 7/2009
(Continued)

*Primary Examiner* — Phu Vu
(74) *Attorney, Agent, or Firm* — Birch, Stewart, Kolasch & Birch, LLP

(57) ABSTRACT

Disclosed is a display device provided to solve any problem caused when a source PCB is provided on the lateral rear side or the rear side of a middle frame, to solve any additional problem caused when the source PCB is provided on the side surface of the middle frame, and to ensure rigidity of the middle frame and optimize the number of processes and associated costs. The display device includes a display panel, a middle frame comprising a rear-surface portion located in a rear of the display panel and a support portion configured to form a sidewall on one side edge of the rear-surface portion, a guide panel coupled to the middle frame so as to surround an outer periphery of a side surface of the middle frame, a seating portion provided on the guide panel so as to form a portion of a side surface of the guide panel and surround the support portion, a source PCB seated on an outer surface of the seating portion, a member layer configured to connect one side of the display panel and the source PCB to each other, and a top case configured to cover the seating portion and the side surface of the guide panel and to define a space along with the source PCB.

14 Claims, 15 Drawing Sheets

(51) Int. Cl.
*G02F 1/1345* (2006.01)
*F21V 8/00* (2006.01)
(52) U.S. Cl.
CPC .. *G02B 6/009* (2013.01); *G02F 2001/133314* (2013.01); *G02F 2001/133317* (2013.01); *G02F 2001/133322* (2013.01); *G02F 2201/121* (2013.01)

(56) References Cited

U.S. PATENT DOCUMENTS

2011/0261284 A1* 10/2011 Hong ................ G02F 1/133308
  349/58
2014/0375891 A1 12/2014 Hosoki

FOREIGN PATENT DOCUMENTS

| KR | 10-0753735 B1 | 8/2007 |
| KR | 10-1282125 B1 | 7/2013 |
| KR | 10-2016-0070941 A | 6/2016 |
| KR | 10-2016-0076215 A | 6/2016 |

\* cited by examiner (a)

(b)

(a)

(b)

DISPLAY DEVICE AND MANUFACTURING
METHOD THEREOF

CROSS REFERENCE TO RELATED
APPLICATIONS

This application is the National Phase of PCT International Application No. PCT/KR2017/012835, filed on Nov. 14, 2017, which claims priority under 35 U.S.C. 119(a) to Patent Application No. 10-2016-0150921, filed in the Republic of Korea on Nov. 14, 2016, which is hereby expressly incorporated by reference into the present application.

TECHNICAL FIELD

The present invention relates to a display device and a manufacturing method thereof, which take into account the thickness, heat dissipation effects, rigidity, manufacturing processes, and manufacturing costs of the display device.

BACKGROUND ART

In a display device, a middle frame serves to support a display panel so as to protect the display panel, and also serves to secure the rigidity of the entire display device and the display panel.

A source printed circuit board (PCB) refers to a component on which electronic parts and the like are mounted to directly drive the display panel. Such a source PCB is generally fixed to the lateral rear surface or the rear surface of the middle frame.

In this case, the source PCB has the risk of being exposed outward and damaged in a step before the coupling of a rear case. In order to obviate this risk, a cover shield is separately provided, which complicates a manufacturing process and increases costs.

To solve this, a configuration in which the source PCB is provided on the side surface of the middle frame is conceivable.

When the source PCB is provided on the side surface of the middle frame, it is necessary to consider a structure capable of replacing a conventional cover shield and a structure capable of dissipating heat generated in the source PCB and the like.

Meanwhile, when the source PCB is provided on the side surface of the middle frame, the middle frame includes a side-surface support portion, which faces one side surface of the edge, for fixing the source PCB.

The side-surface support portion is a portion of the middle frame, and is generally formed using an integrated mold so as to extend from the rear surface of the middle frame.

The support portion is generally provided in a double-layered form, in order to secure the rigidity of the support portion.

The double-layered form may be obtained as the support portion is bent plural times at one side of the rear surface of the middle frame, and may typically have a "⊏"-shaped cross section.

However, the "⊏"-shaped support portion may not have sufficient rigidity because it is open at one side.

Therefore, to complement the conventional form described above, a reinforcement bracket may be added and coupled to the open area of the "⊏"-shaped support portion so as to increase the rigidity of the support portion.

However, when the reinforcement bracket is added and fixed, a separate process of manufacturing the reinforcement bracket as well as an assembly process need to be added.

Technical Object

An object of the present invention is to solve the above-described problems such as an increase in the number of processes and associated costs due to the provision of a cover shield for a middle frame, and to solve any problem caused when a source PCB is provided on the side surface of the middle frame, as another solution to the above-described problem.

In addition, an object of the present invention is to solve an increase in the number of processes and associated costs attributable to the structure of a reinforcement bracket for securing the rigidity of a middle frame.

Technical Solution

To achieve the above or other objects, according to one aspect of the present invention, there is provided a display device including a display panel, a middle frame including a rear-surface portion located in a rear of the display panel and a support portion configured to form a sidewall on one side edge of the rear-surface portion, a guide panel coupled to the middle frame so as to surround an outer periphery of a side surface of the middle frame, a seating portion provided on the guide panel so as to form a portion of a side surface of the guide panel and surround the support portion, a source PCB seated on an outer surface of the seating portion, a member layer configured to connect one side of the display panel and the source PCB to each other, and a top case configured to cover the seating portion and the side surface of the guide panel and to define a space along with the source PCB.

In addition, according to another aspect of the present invention, outer surfaces of the support portion and the seating portion may be formed perpendicular to the display panel.

In addition, according to another aspect of the present invention, the guide panel may further include a rib formed on the outer surface of the seating portion so that one side edge of the source PCB is seated on the rib.

In addition, according to another aspect of the present invention, the display device may further include a heat dissipation pad including one surface in contact with a portion of an inner surface of the top case and a remaining surface in contact with a portion of an outer surface of the member layer.

In addition, according to another aspect of the present invention, the support portion may include an inner sidewall configured to extend forward from the one side edge of the middle-frame rear-surface portion, a flange configured to extend outward from a front end of the inner sidewall, an outer sidewall configured to extend rearward from an outer end of the flange, and a fixing bracket configured to extend from a first position on a rear end of the outer sidewall and to be bent inward so as to be supported by a second area of the middle-frame rear-surface portion.

In addition, according to another aspect of the present invention, the middle frame may be integrally formed from a single material.

In addition, according to another aspect of the present invention, a fixing bracket and a second area of the middle-frame rear-surface portion may be fixed by compression molding.

In addition, according to another aspect of the present invention, the compression molding may include a punching process of forming fastening holes in the fixing bracket and the second area of the middle-frame rear-surface portion.

In addition, according to another aspect of the present invention, the display device may further include a screw coupled into the fastening holes so as to fasten the fixing bracket and the middle-frame rear-surface portion to each other.

In addition, according to another aspect of the present invention, the display device may further include an opening formed at a position of an outer sidewall in an area corresponding to a shape of a fixing bracket.

In addition, according to another aspect of the present invention, the display device may further include an expansion bracket configured to extend outward from a first area including a position on a rear end of an outer sidewall so as to connect a fixing bracket and the outer sidewall to each other.

In addition, according to another aspect of the present invention, the display device may further include a first slit formed in opposite boundaries of the first area on the rear end of the outer sidewall, and a boundary slit formed in a boundary between the fixing bracket and the outer sidewall.

In addition, according to another aspect of the present invention, the fixing bracket and the expansion bracket may be located in the same plane.

In addition, according to another aspect of the present invention, a fixing bracket and an outer sidewall may be perpendicular to each other, a flange and an inner sidewall may be perpendicular to each other, the inner sidewall and the middle frame may be perpendicular to each other, and the flange and the outer sidewall may be perpendicular to each other.

In addition, according to another aspect of the present invention, there is provided a method of manufacturing a display device including a first bending operation of bending a fixing bracket from an outer sidewall, a second bending operation of bending a flange from an inner sidewall, a third bending operation of bending the inner sidewall from a middle-frame rear-surface portion, and a fourth bending operation of bending the flange from the outer sidewall, wherein the inner sidewall, the flange, the outer sidewall, and the fixing bracket form "☐"-shaped cross section, and the fixing bracket is located in the same plane as the middle-frame rear-surface portion.

In addition, according to another aspect of the present invention, the first bending operation to the fourth bending operation may be performed in any sequence, and the first bending operation is not performed after the second bending operation and the fourth bending operation.

In addition, according to another aspect of the present invention, the method may further include a notching operation before the first bending operation, and the notching operation may include forming an outer boundary of the middle frame and forming a first slit in opposite boundaries of a first area of a rear end of the outer sidewall and a boundary slit in a boundary between the fixing bracket and the outer sidewall.

Advantageous Effects

The effects of a display device and a display device manufacturing method according to the present invention are be described below.

With at least one of the embodiments of the present invention, by replacing a conventional cover shield with a top case, it is possible to prevent an increase in the number of manufacturing processes and associated costs.

With at least one of the embodiments of the present invention, it is possible to prevent any problem related to a heat dissipation structure, which may occur when a source PCB is located on the side surface of a middle frame.

With at least one of the embodiments of the present invention, it is possible to complement the rigidity of the middle frame without adding a separate member.

In addition, with at least one of the embodiments of the present invention, it is possible to couple a fixing bracket and a rear-surface portion of the middle frame to each other without adding a separate process.

In addition, with at least one of the embodiments of the present invention, the fixing bracket and an expansion bracket may function as opposite surfaces to which other parts may be fastened.

The additional range of applicability of the present invention will be apparent from the following detailed description. However, since various modifications and alterations will be clearly understood by those skilled in the art within the spirit and scope of the present invention, it should be understood that a detailed description and particular embodiments such as exemplary embodiments of the present invention are merely given by way of example.

BEST MODE

Figure 1:
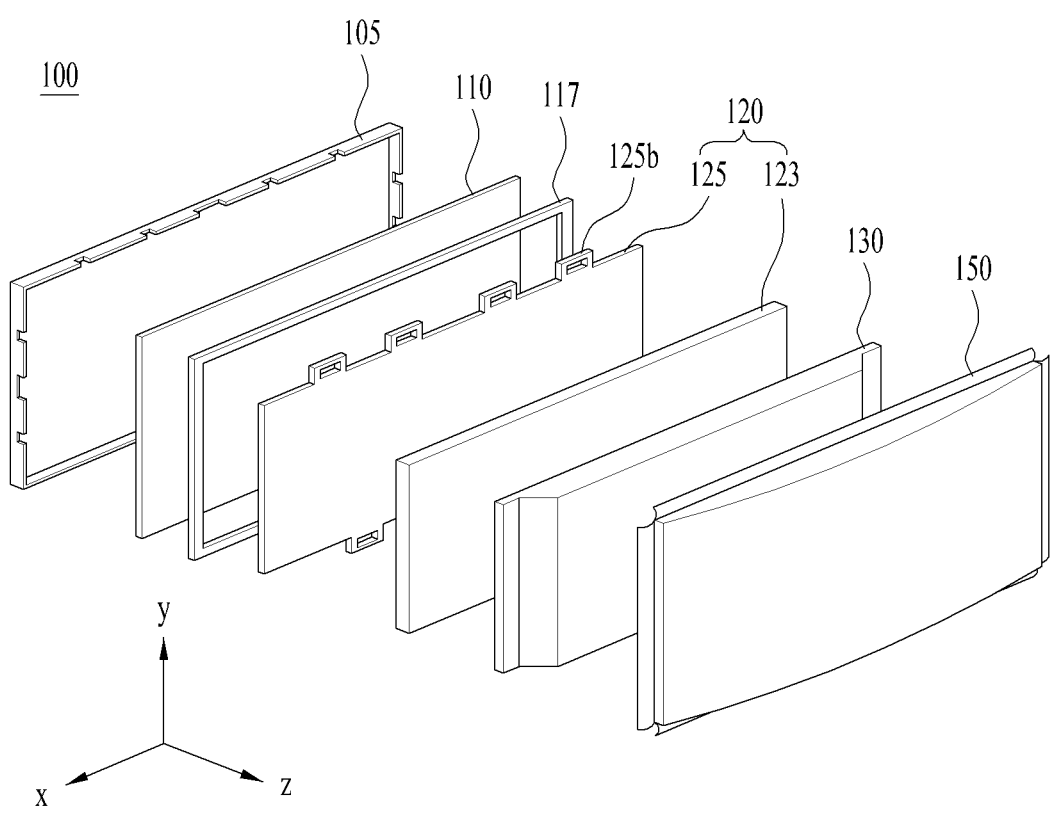
FIG. 1 is an exploded perspective view of a display device according to the present invention.

Hereinafter, embodiments disclosed in this specification will be described in detail with reference to the accompanying drawings, the same or similar elements are denoted by the same reference numerals even though they are depicted in different drawings, and a repeated description thereof will be omitted. With respect to constituent elements used in the following description, suffixes "module" and "unit" are given or mingled with each other only in consideration of ease in the preparation of the specification, and do not have or serve as different meanings. In addition, in the following description of the embodiments disclosed in this specification, a detailed description of known functions or configurations incorporated herein will be omitted when it may make the subject matter of the disclosure rather unclear. In addition, the accompanying drawings are merely provided to allow those skilled in the art to easily understand the embodiments disclosed in this specification, and the technical ideas disclosed in this specification are not limited by the accompanying drawings, and all modifications, equivalents, and substitutions that fall within the spirit and technical range of the present invention should be understood as belonging to the scope of the disclosure.

In a display device, a middle frame serves to support a display panel so as to protect the display panel, and also serves to secure the rigidity of the entire display device and the display panel.

A source printed circuit board (PCB) refers to a component on which electronic parts and the like are mounted to directly drive the display panel.

Such a source PCB is generally fixed to the lateral rear surface or the rear surface of the middle frame.

In this case, the source PCB has the risk of being exposed outward and damaged in a step before the coupling of a rear case. In order to obviate this risk, a cover shield is separately provided, which complicates a manufacturing process and increases costs.

To solve this, a configuration in which the source PCB is provided on the side surface of the middle frame is conceivable.

When the source PCB is provided on the side surface of the middle frame, it is necessary to consider a structure capable of replacing a conventional cover shield and a structure capable of dissipating heat generated in the source PCB and the like.

Meanwhile, when the source PCB is provided on the side surface of the middle frame, the middle frame includes a side-surface support portion, which faces one side surface of the edge, for fixing the source PCB.

The side-surface support portion is a portion of the middle frame, and is generally formed using an integrated mold so as to extend from the rear surface of the middle frame.

The support portion is generally provided in a double-layered form, in order to secure the rigidity of the support portion.

The double-layered form may be obtained as the support portion is bent plural times at one side of the rear surface of the middle frame, and may typically have a "⊏"-shaped cross section.

However, the "⊏"-shaped support portion may not have sufficient rigidity because it is open at one side.

Therefore, to complement the conventional form described above, a reinforcement bracket may be added and coupled to the open area of the "⊏"-shaped support portion so as to increase the rigidity of the support portion.

However, when the reinforcement bracket is added and fixed, a separate process of manufacturing the reinforcement bracket as well as an assembly process need to be added.

Thus, there is a demand for a structure capable of completing the problems described above.

FIG. 1 is an exploded perspective view of a display device 100 according to the present invention.

A display panel 110 may be located at the front of the display device 100, and may display an image. The display panel 110 may include a plurality of pixels to output an image by adjusting hue, saturation, and brightness (HSB) for each pixel.

The display panel 110 may be divided into an active area in which an image is displayed and an inactive area in which no image is displayed. The display panel 110 may include a front substrate and a rear substrate, which face each other with a liquid crystal layer interposed therebetween.

The front substrate may include a plurality of pixels each including red (R), green (G), and blue (B) sub-pixels. The front substrate may create red, green, or blue based on a control signal.

The rear substrate may include switching elements. The rear substrate may switch a pixel electrode. For example, the pixel electrode may change the molecular arrangement of a liquid crystal layer based on a control signal applied from the outside. The liquid crystal layer may include a plurality of liquid crystal molecules.

The liquid crystal molecules may be changed in arrangement depending on the difference in voltage between the pixel electrode and a common electrode. The liquid crystal layer may transmit light provided from a backlight unit 120 to the front substrate.

A top case 105 may cover at least a portion of the front surface and the side surface of the display panel 110.

The top case 105 may take the form of a centrally empty rectangular frame. Since the center of the top case 105 is empty, an image on the display panel 110 may be displayed outward.

The top case 105 may be divided into a front cover 1051 and a side cover 1052. Specifically, the top case may be divided into the front cover 1051, which is located on the front surface of the display panel 110, and the side cover 1052, which is located on the side surface of the display panel 110. The front cover 1051 and the side cover 1052 may be separately configured. One of the front cover 1051 and the side cover 1052 may be omitted. For example, for the purpose of an aesthetically pleasing design or the like, the front cover 1052 may not be present, and only the side cover 1052 may be present.

The top case 105 may define the external appearance of a portion of the front surface and a portion of the side surface of the display device 100. That is, the top case may also serve as a conventional front cover, which defines the external appearance of the front surface of a display device.

A guide panel 140 may be located in the rear of the display panel 110. The guide panel 140 may support a portion of the rear surface of the display panel 110.

In addition, the guide panel 140 may serve to fix the backlight unit 120, which will be described below.

The guide panel 140 may be in contact with the outer rim of the display panel 110. The guide panel 140 may be coupled to a middle frame 130.

The backlight unit 120 may be located in the rear of the display panel 110. The backlight unit 120 may include a plurality of light sources. The light sources of the backlight unit 120 may be of a direct type or an edge type. The edge-type backlight unit 120 may further include a light guide unit or a light guide panel (LGP).

The backlight unit 120 may be disposed on the front surface of the middle frame 130. For example, the plurality of light sources may be disposed on the front surface of the middle frame 130, and may be collectively called a direct-type backlight unit.

The backlight unit 120 may be driven in its entirety, or a portion thereof may be driven, via for example local dimming or impulse driving. The backlight unit 120 may include an optical sheet 125 and an optical layer 123.

The optical sheet 125 may disperse light of the light sources. The optical sheet 125 may be configured with a plurality of layers. For example, the optical sheet 125 may include at least one prism sheet and/or at least one diffuser sheet.

The optical sheet 125 may include at least one coupling portion 125d. The coupling portion 125d may be coupled to the top case 105 and/or a rear case 150. Specifically, the coupling portion 125d may be directly coupled to the top case 105 and/or the rear case 150. Alternatively, the coupling portion 125d may be coupled to a structure, which is coupled on the top case 105 and/or the rear case 150. Specifically, the coupling portion 125d may be indirectly coupled to the top case 105 and/or the rear case 150.

The optical layer 123 may include a light source or the like.

The middle frame 130 may support components of the display device 100. For example, the backlight unit 120 or the like may be coupled to the middle frame 130. The middle frame 130 may be formed of a metal such as an aluminum alloy.

The rear case 150 is provided on the rear surface of the display panel 110. The rear case 150 refers to a component that forms a part or the entirety of the rear surface of the display device 100 and is coupled to the top case 105.

The rear case 150 may protect inner components from the outside. At least a portion of the rear case 150 may be coupled to the middle frame 130 and/or the top case 105. The rear case 150 may be an injection-molded article formed of a resin.

The rear case 150 may cover a display module such as the display panel 110 or the backlight unit 120 of the display device 100 and the rear surface of the middle frame 130 provided on the rear surface of the display module so as to define the external appearance of the rear surface of the display device 100.

Electronic parts may be mounted on the rear surface or the front surface of the middle frame 130.

The rear case 150 may cover the middle frame 130 so as to define the external appearance of the rear surface of the display device 100.

Figure 2:
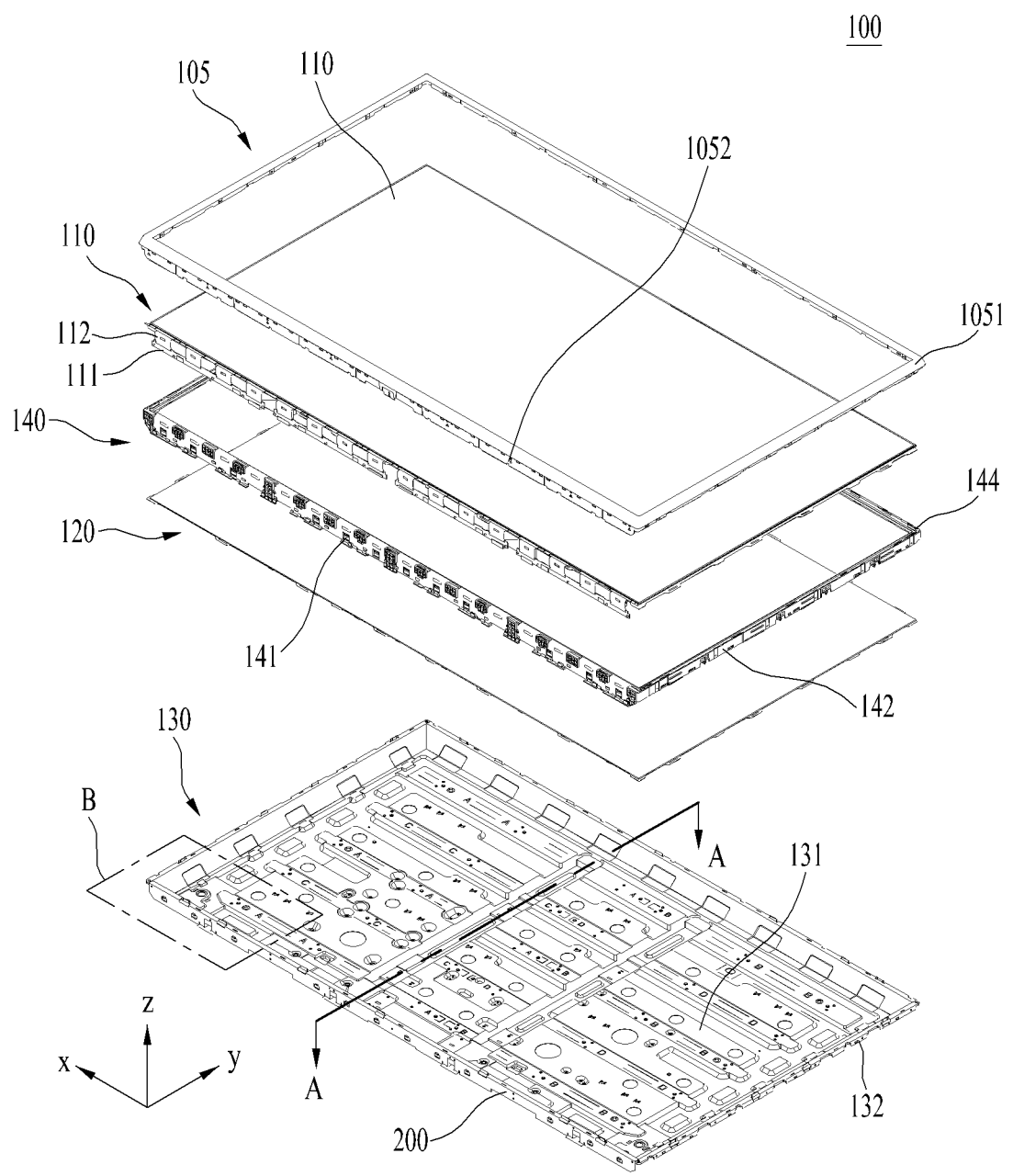
FIG. 2 is a partial exploded front perspective view of the display device according to the present invention.
Figure 3:
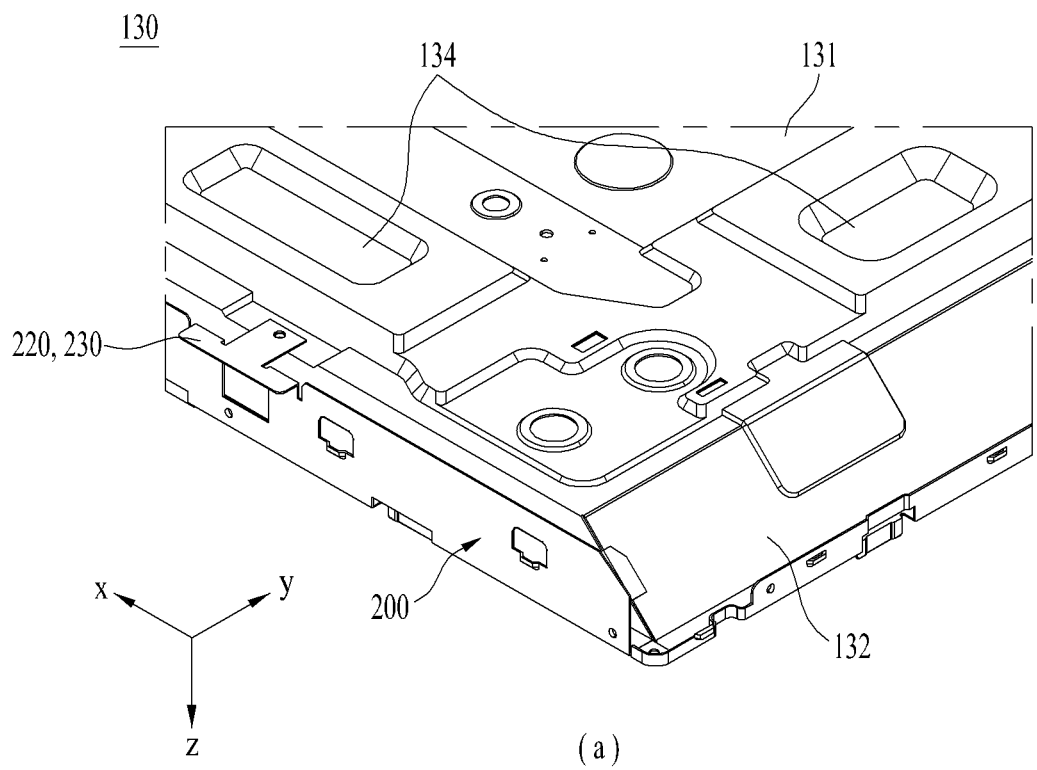
FIG. 3(a) is a partial rear perspective view of a middle frame according to the present invention.
FIG. 3(b) is a partial cross-sectional view of the middle frame taken in direction A-A' of FIG. 2.
Figure 3:
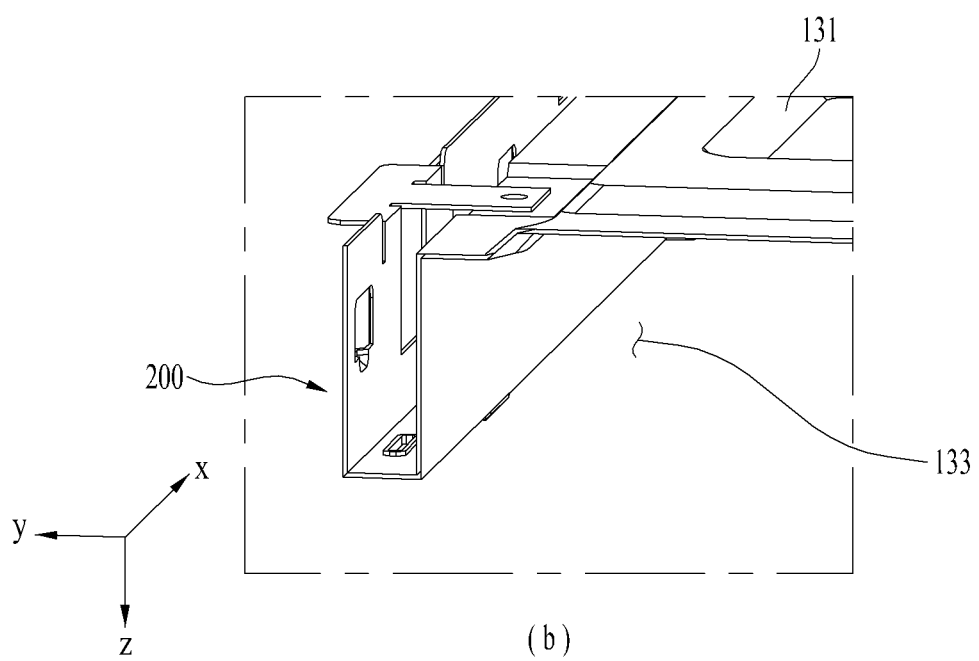
Figure 4:
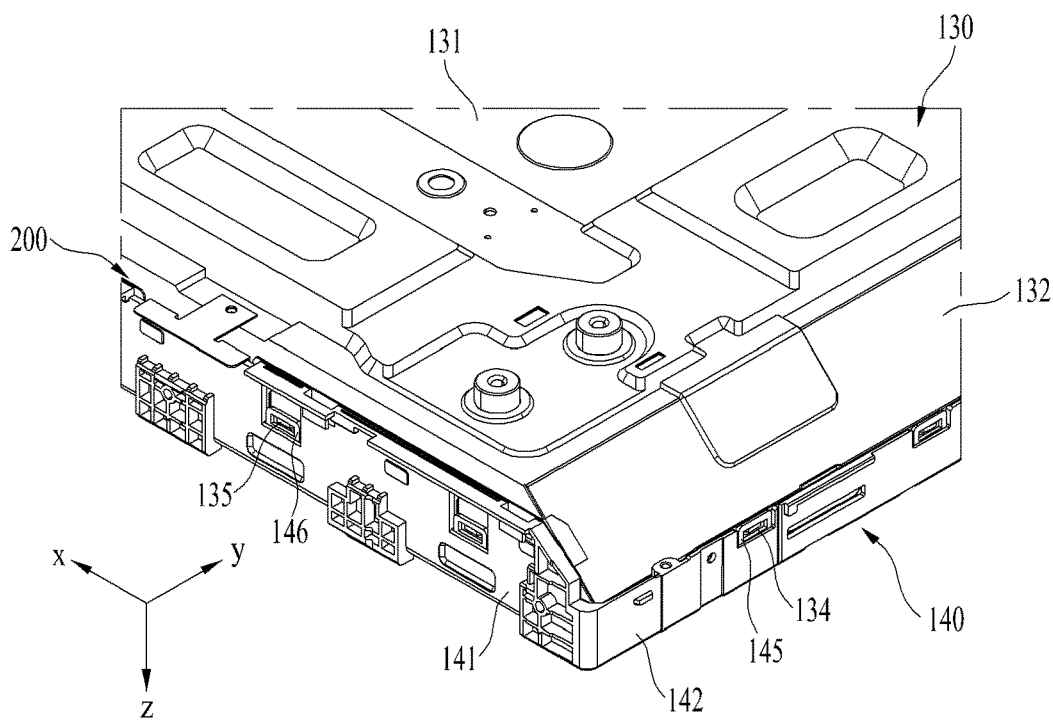
FIG. 4(a) is a partial rear perspective view of the state in which a guide panel is coupled to the middle frame.
FIG. 4(b) is a partial cross-sectional view of the middle frame and the guide panel taken in direction A-A' of FIG. 2.
Figure 4:
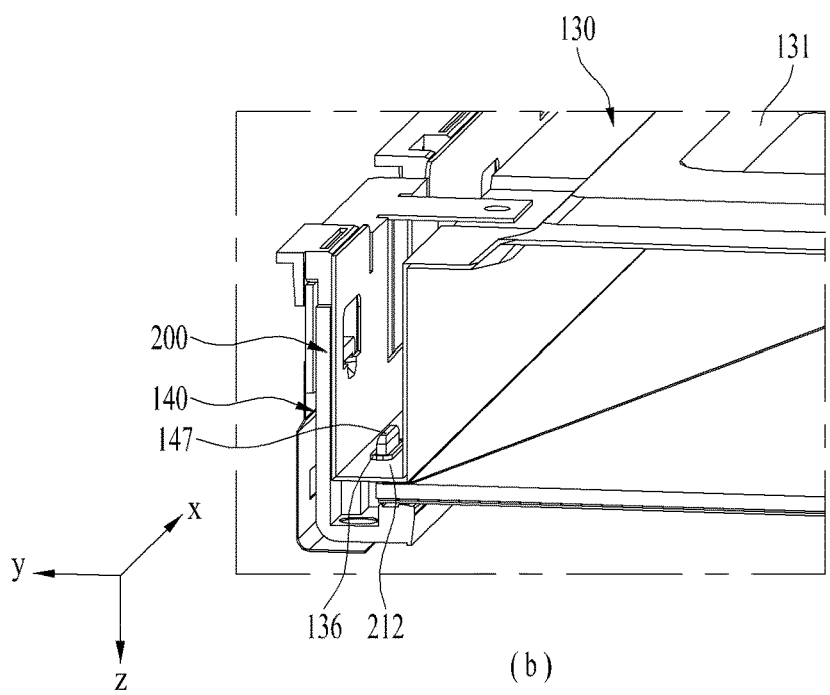

FIG. 2 is a partial exploded front perspective view of the display device 100 according to the present invention.

FIGS. 3 to 6 are perspective views illustrating the sequential coupling of components of FIG. 2.

Figure 7:
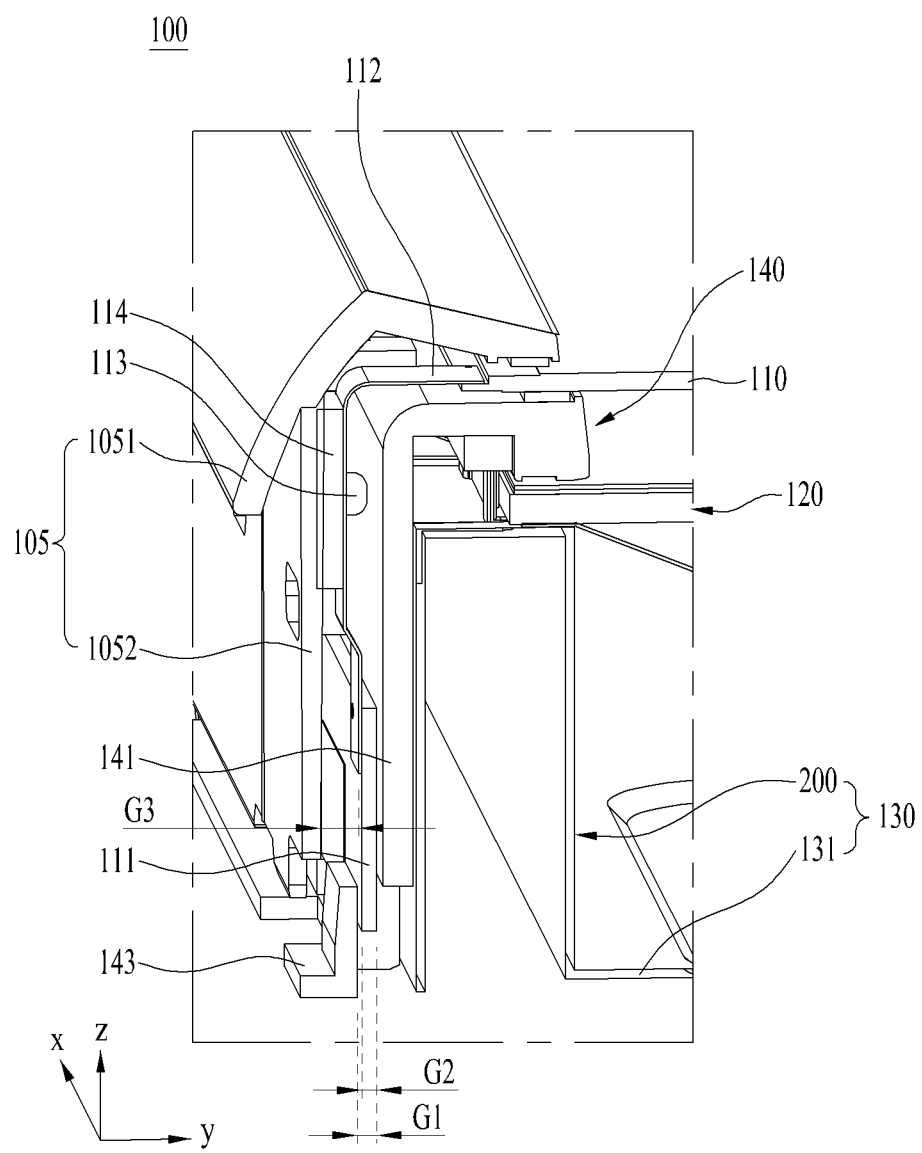
FIG. 7 is a partial cross-sectional view taken in direction A-A' illustrating the coupled state of the components of FIG. 2.

FIG. 7 is a cross-sectional view taken in direction A-A' illustrating the coupled state of the display device 100.

For convenience of description, FIGS. 2 to 7 will be referenced together.

The backlight unit 120 is disposed on the front surface of the middle frame 130.

The guide panel 140, which is coupled to the front surface of the middle frame 130, fixes both the middle frame 130 and the backlight unit 120.

The display panel 110 is disposed on the front surface of the backlight unit 120. A source PCB 111, which is connected to the display panel 110 via a member layer 112, is directly seated on a seating portion 141 of the guide panel 140.

The top case 105 is coupled to the front side of the aforementioned components so as to surround at least a portion of the side surface and the rim of the front surface of the components, thereby defining the external appearance of at least one area.

A detailed structure of the components will be described below.

FIG. 3(a) is a partial rear perspective view of the middle frame 130 according to the present invention, and FIG. 3(b) is a partial cross-sectional view of the middle frame 130 taken in direction A-A' of FIG. 2.

The middle frame 130 includes a rear-surface portion 131 and a side-surface portion 132. A support portion 200, which will be described below, is a portion of the side-surface portion 132.

The rear-surface portion 131 of the middle frame 130 is located in the rear of the display panel 110.

The side-surface portion 132 of the middle frame 130 extends from the edge of the rear-surface portion 131 so as to define a side surface area of the middle frame 130. In some cases, the side-surface portion 132 may form an inclined surface.

The support portion 200 of the middle frame 130 is a portion of the side-surface portion 132, and forms a sidewall at one side edge of the rear-surface portion 131. The one side edge may correspond to the one side at which the source PCB 111 of the display panel 110 is provided. The support portion 200 is significant in that it is the base of a seating area for the source PCB 111, which will be described below.

That is, the side-surface portion 132 of the middle frame 130, which includes the support portion 200, protrudes forwards from four edges of the rear-surface portion 131 of the middle frame 130 so as to form a side surface area, and also forms a recessed area 133 along with the rear-surface portion 131 of the middle frame 130.

Parts such as the light sources of the backlight unit 120 may be mounted in the recessed area 133 of the middle frame 130.

The rear-surface portion 131 of the middle frame 130 may be provided with a plurality of protruding surfaces 134, which protrude forward from some areas of the rear-surface portion. The protruding surfaces 134 serve to secure the rigidity of the middle frame 130 and to support parts such as the light sources of the backlight unit 120.

FIG. 4(a) is a partial rear perspective view of the state in which the guide panel 140 is coupled to the middle frame 130, and FIG. 4(b) is a partial cross-sectional view of the middle frame 130 and the guide panel 140 taken in direction A-A' of FIG. 2.

The middle frame 130 takes the form of a rectangular frame having an opening (see FIG. 2).

A side surface 142 of the guide panel 140 may surround the outer periphery of the side surface of the middle frame 130, and a front surface 144 of the guide panel may form an area on which the display panel 110 is seated.

In particular, the side surface 142 of the guide panel 140 is configured so as to be in contact with the side surface of the middle frame 130. Through the provision of an area for bonding therebetween, the guide panel and the middle frame may have a stabilized structure and may achieve rigidity.

The guide panel 140 may be fixed to the middle frame 130, and more particularly, may be hook-coupled thereto.

A plurality of first hooks 134 is formed on the outer periphery of the side-surface portion 132 of the middle frame 130, and first hook holes 145 are formed at a plurality of positions in the guide panel 140 corresponding to the respective first hooks 134 so as to realize hook-coupling therebetween.

The guide panel 140 may include the seating portion 141. The seating portion 141 forms a portion of the side surface 142 of the guide panel 140.

In particular, the seating portion 141 is provided on a surface of the middle frame 130 corresponding to the support portion 200 so as to surround the support portion 200.

In particular, the seating portion 411 may be supported by the support portion 200 of the middle frame 130 so as to obtain a stabilized structure.

The hook-coupling of the guide panel 140 to the middle frame 130 may also be implemented between the support portion 200 and the seating portion 141.

A second hook hole 146 is formed in the outer surface of the support portion 200, and a second hook 135 is formed on each position of the guide panel 140 corresponding to the second hook hole 146 so as to realize hook-coupling therebetween.

The coupling of the second hook hole 146 and the second hook 135 may be implemented inside the outer surface of the seating portion 141 so as not to interfere with the coupling of the source PCB 111 and the seating portion 141.

In addition, referring to FIG. 4(b), a third hook hole 136 is formed in a flange 212 of the support portion 200, which will be described below, and a third hook 147 is formed on each position of the guide panel 140 corresponding to the third hook hole 136 so as to realize hook-coupling. The third hook 147 may protrude in a direction from the front surface to the rear surface of the display device 100, unlike the first hook 134 and the second hook 135.

Figure 5:
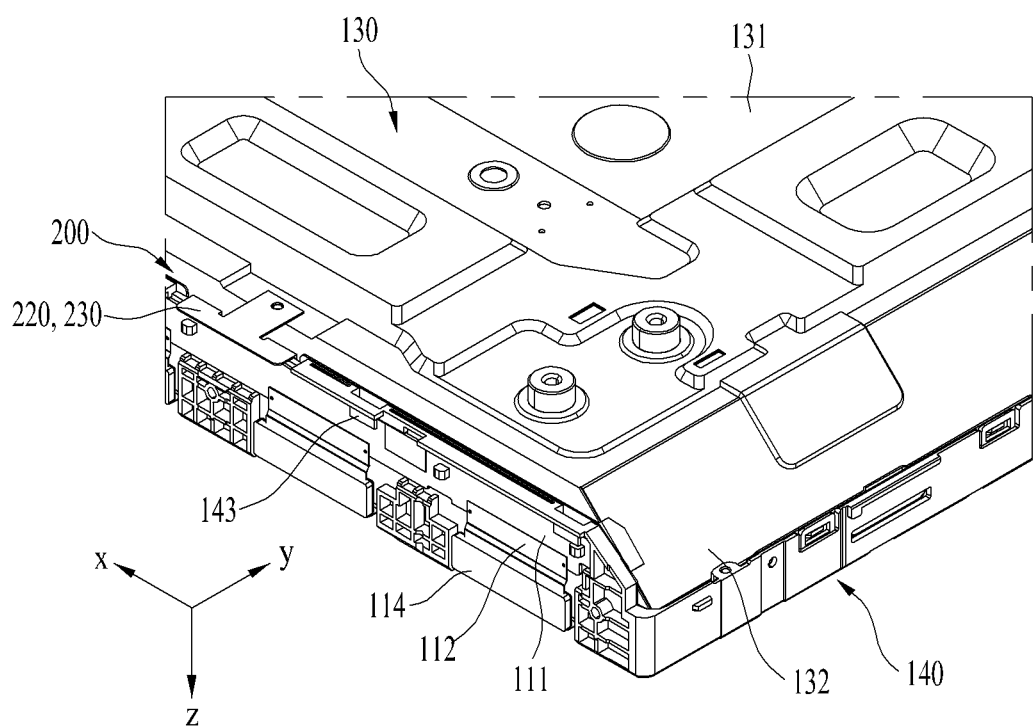
FIG. 5 is a partial rear perspective view of the state in which a source PCB 111 and a display panel 110 are coupled to a middle frame 130 and a guide panel 140 of FIG. 4(a).

FIG. 5 is a partial rear perspective view illustrating the state in which the source PCB 111 and the display panel 110 are coupled to the middle frame 130 and the guide panel 140 of FIG. 4(a).

Directly driven parts of the display panel 110 are mounted on the source printed circuit board (PCB) 111.

The source PCB 111 is seated on the outer surface of the seating portion 141 of the guide panel 140.

That is, the source PCB 111 is provided on the side surface of the display device 100 so as to be perpendicular to the display panel 110. This configuration is defined as a half-folding type.

The half-folding type is distinguished from a full-folding type in which the source PCB 111 is located at the lateral rear side or the rear side of the middle frame 130.

The half-folding type is appropriately used in the display device 100 including the direct-type backlight unit 120 having a predetermined thickness or more, due to the width of the source PCB 111.

In the half-folding-type display device 100, in order to realize the above-described positional relationship of the source PCB 111, the outer surfaces of the support portion 200 and the seating portion 141 may be perpendicular to the display panel 110.

The guide panel 140 may further include a rib 143, which is formed on the outer surface of the seating portion 141 so that one side edge of the source PCB 111 is seated on the rib 143. At this time, the one side edge may be an edge that is away from the display panel 110, among the width-direction edges of the source PCB 111.

The rib 143 may prevent the source PCB 111 from being separated from the guide panel 140. Details of the positional relationship between the rib 143 and the source PCB 111 will be described below.

Figure 6:
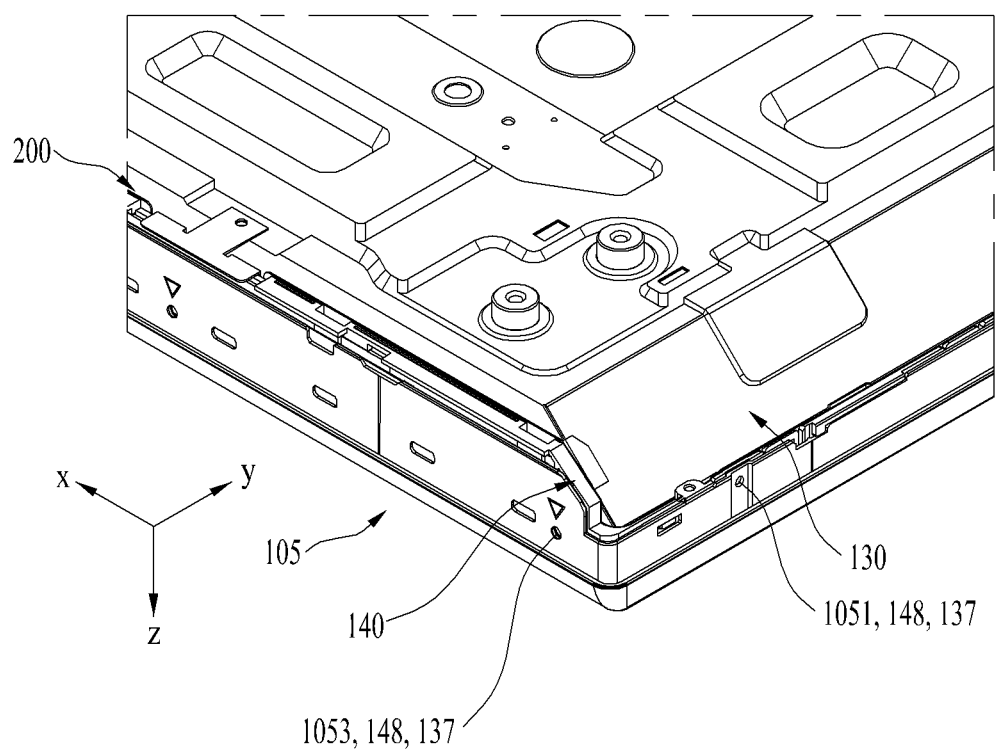
FIG. 6 is a partial rear perspective view of the state in which a top case 105 is coupled to the assembly of the middle frame 130, the guide panel 140, the display panel 110, and the source PCB 111 of FIG. 5.

FIG. 6 is a partial rear perspective view of the state in which the top case 105 is coupled to the assembly of the middle frame 130, the guide panel 140, the display panel 110, and the source PCB 111 of FIG. 5.

The top case 105 covers the side surface 142 including the seating portion 141 of the guide panel 140. In addition, the top case 105 surrounds the outer surface of the source PCB 111 so as to protect the source PCB 111 from external force. Details of the positional relationship between the top case 105 and the source PCB 111 will be described below.

The top case 105 may be fixed to the middle frame 130 or the guide panel 140 via screwing. For this screwing, the top case 105 may be provided with a first hole, the guide panel 140 may be provided with a second hole, the middle frame 130 may be provided with a third hole, and the first hole, the second hole, and the third hole may be provided so as to overlap each other.

FIG. 7 is a cross-sectional view taken in direction A-A' illustrating the coupled state of components of FIG. 2.

The rib 143 serves as a guide to prevent one side edge of the source PCB 111 from being separated in the thickness direction. As described above, the one side edge of the source PCB 111 may be the edge that is located opposite the display panel 110, among longitudinal edges.

The rib 143 may be provided on the outer surface of the seating portion 141, and may form a gap G1 in which one side edge of the source PCB 111 is seated.

The rib 143 may protrude from the seating portion 141 of the guide panel 140 in a direction from the rear surface to the front surface of the display device 100 so that the gap G1 is open to the front side.

With the rib 143 formed on only one side, a process of seating the source PCB 111 on the seating portion 141 of the guide panel 140 may be simply performed. Since the source PCB 111 is connected to the display panel 110 by the member layer 112, which will be described below, so as to be moved together therewith, there is no risk of the source PCB being separated in a direction from the rear surface to the front surface of the display device 100 after the display panel 110 is fixed to the guide panel 140 or the like. Thus, it is sufficient to prevent the source PCB 111 from being separated in the thickness direction.

At this time, the gap G1 defined by the rib 143 may be wider than the thickness G2 of the source PCB 111 so as to provide a margin. Due to the margin provided by the gap G1 of the rib 143, the source PCB 111 is seated in the rib 143, rather than being completely fitted therein. With this margin, the source PCB 111 may be moved when the display panel 110 is moved, which may prevent damage to the member layer 112, which interconnects the two members.

The rib 143 may be provided in a plural number in the longitudinal direction of the seating portion 141 of the guide panel 140 in order to grip the entire source PCB 111.

The top case 105 may form the space G3 along with the source PCB 111. The space G3 between the top case 105 and the source PCB 111 assists movement of the source PCB 111. That is, the space has the same role as the margin defined by the rib 143 described above.

Figure 8:
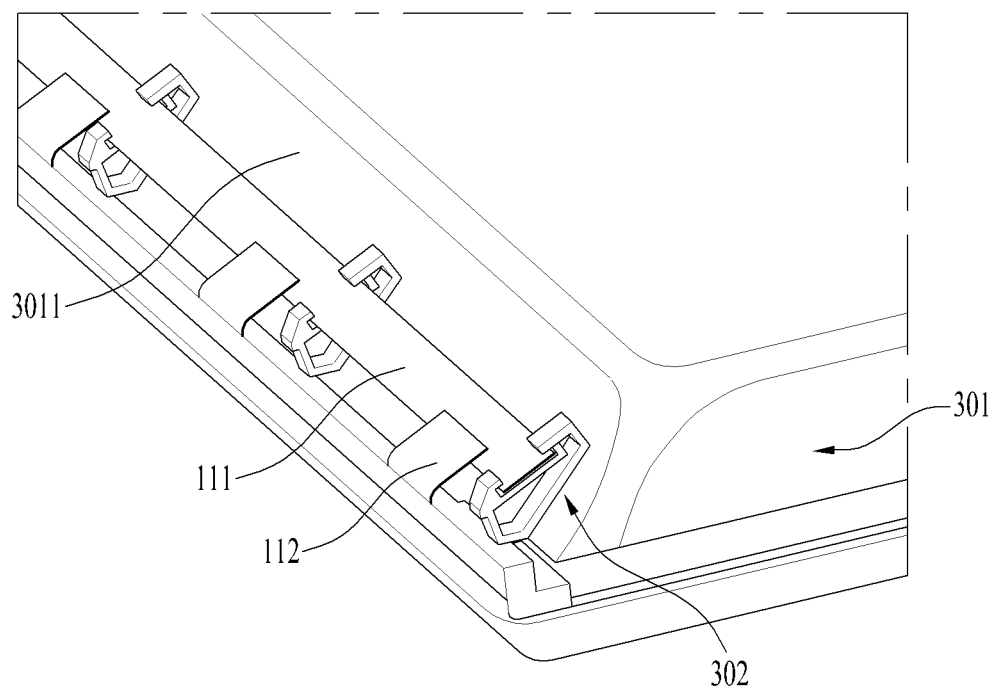
FIG. 8 is a partial perspective view of a conventional full-folding-type display device.

FIG. 8 is a partial perspective view of a conventional full-folding-type display device 300.

As described above, in the full-folding-type display device 300, the source PCB 111 is provided on the lateral rear side 3011 or the rear side of a middle frame 301.

The source PCB 111 is fixed by a holder 302, which is provided on the lateral rear side 3011 of the middle frame 301.

Even if the source PCB 111 is fixed by the holder 302, the source PCB is still exposed before the assembly of the rear case 150 (see FIG. 1).

Figure 9:
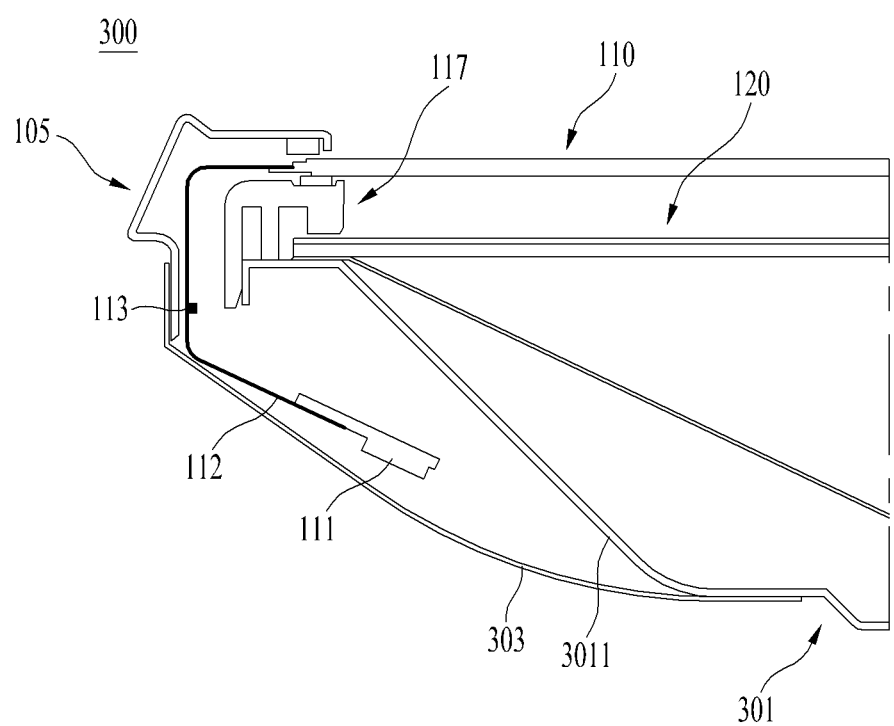
FIG. 9 is a partial cross-sectional view of the conventional full-folding-type display device.
Figure 10:
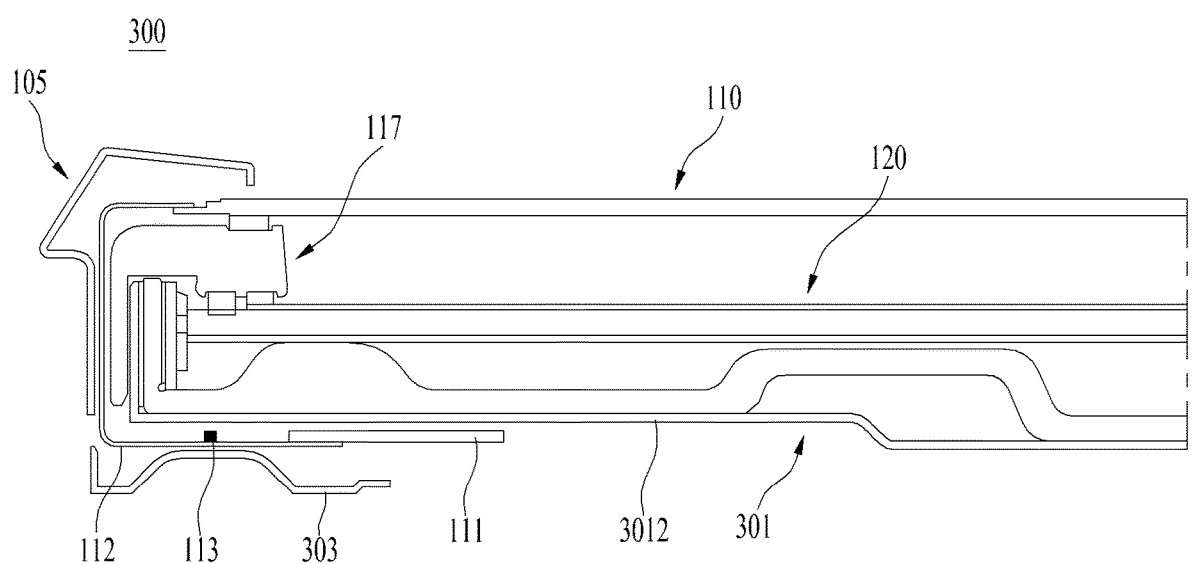
FIG. 10 is a partial cross-sectional view of the conventional full-folding-type display device.

FIGS. 9 and 10 are partial cross-sectional views of the conventional full-folding-type display device 300.

FIG. 9 illustrates the case in which the source PCB 111 is provided on the lateral rear side 3011 of the middle frame 130, and FIG. 10 illustrates the case in which the source PCB 111 is provided on the rear side 3012 of the middle frame 130.

In order to solve the above-described full-folding-type display device, a cover shield 303 may be provided. However, the cover shield 303 inevitably causes an increase in the number of manufacturing processes and the manufacturing costs.

In addition, in some cases, the cover shield causes an increase in the thickness of the entire display device 300.

Referring again to FIG. 7, in the present invention, since the top case 105 covers the source PCB 111, an additional structure such as the cover shield 303 of FIGS. 9 and 10 is unnecessary.

The member layer 112 electrically interconnects one side of the display panel 110 and the source PCB 111.

The member layer 112 may be connected to one side of the display panel 110 and may be bent perpendicularly so as to be connected to the source PCB 111.

The member layer 112 may have a chip on film (COF) form or a flexible printed circuit board (FPCB) form.

A drive integrated circuit (IC) chip 113 may be provided inside the member layer 112 to drive the display panel 110.

In the process of driving the display device 100, a great amount of heat occurs in the drive IC chip 113, and thus a structure of dissipating the heat is necessary.

A heat dissipation pad 114 is provided between the top case 105 and the member layer 112. The heat dissipation pad 114 serves to outwardly dissipate heat generated in the source PCB 111, the drive IC chip 113, the member layer 112 or the like, in cooperation with the top case 105.

That is, one surface of the heat dissipation pad 114 is in contact with a portion of the inner surface of the top case 105, and the other surface is in contact with a portion of the outer surface of the member layer 112. The heat dissipation pad 114 may be formed of a metal in order to secure heat dissipation performance, and more particularly, may be formed of aluminum.

Figure 11:
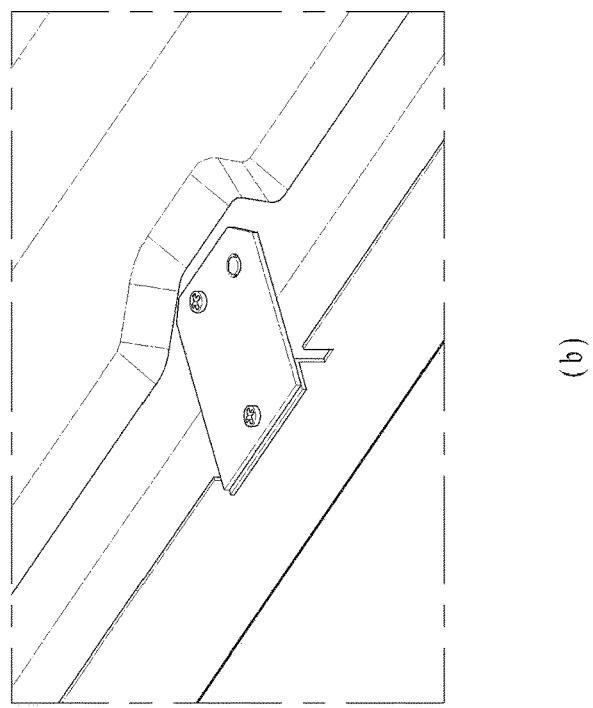
FIG. 11(a) is a perspective view before the coupling of a reinforcement bracket.
FIG. 11(b) is a perspective view after the coupling of the reinforcement bracket.
Figure 11:
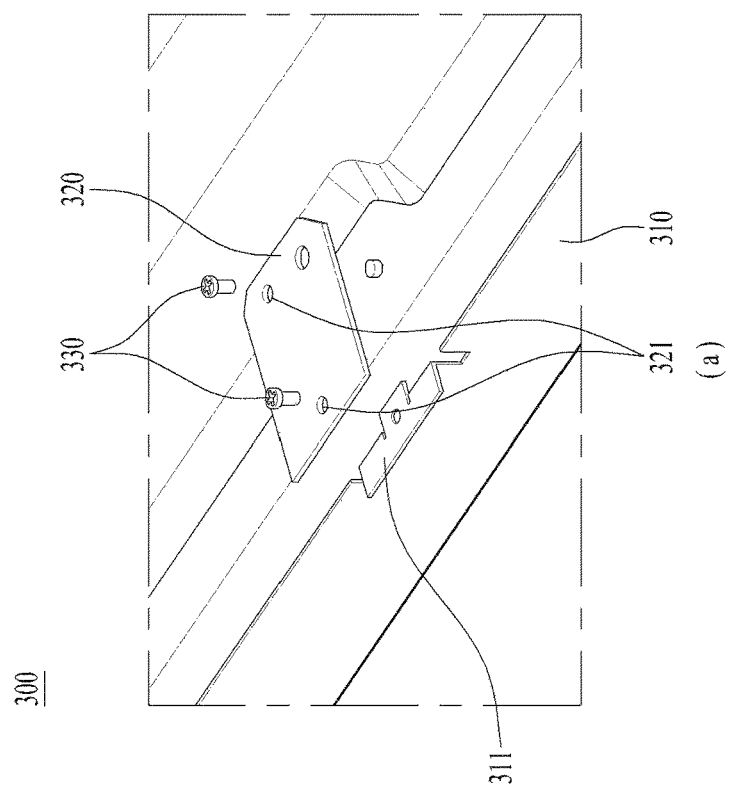

FIG. 11 is a perspective view of a support portion 310 of the conventional display device 300.

FIG. 11(a) is a perspective view before the coupling of a reinforcement bracket 320, and FIG. 11(b) is a perspective view after the coupling of the reinforcement bracket 320.

In order to secure the rigidity of the support portion 310, the support portion 310 is generally provided in a double-layered form.

The double-layered form may be obtained by folding one side of the rear surface of the middle frame plural times, and may typically have a "⊏"-shaped cross section.

However, the "⊏"-shaped support portion 310 may not have sufficient rigidity because it is open at one side.

Thus, in order to complement the conventional form, the reinforcement bracket 320 may be added and coupled to the open area of the "⊏"-shaped support portion 310 so as to complement the rigidity thereof.

When the reinforcement bracket 320 is added and fixed, a process of additionally manufacturing the reinforcement bracket 320 and a member for the same are added.

In addition, due to the fact that fixing needs to be performed at at least two positions, large numbers of screw holes 321 and fastening screws 333 are required.

In addition, in order to use the fastening screws, it is necessary to form a bonding surface 311 between the reinforcement bracket 320 and the support portion 310.

Figure 12:
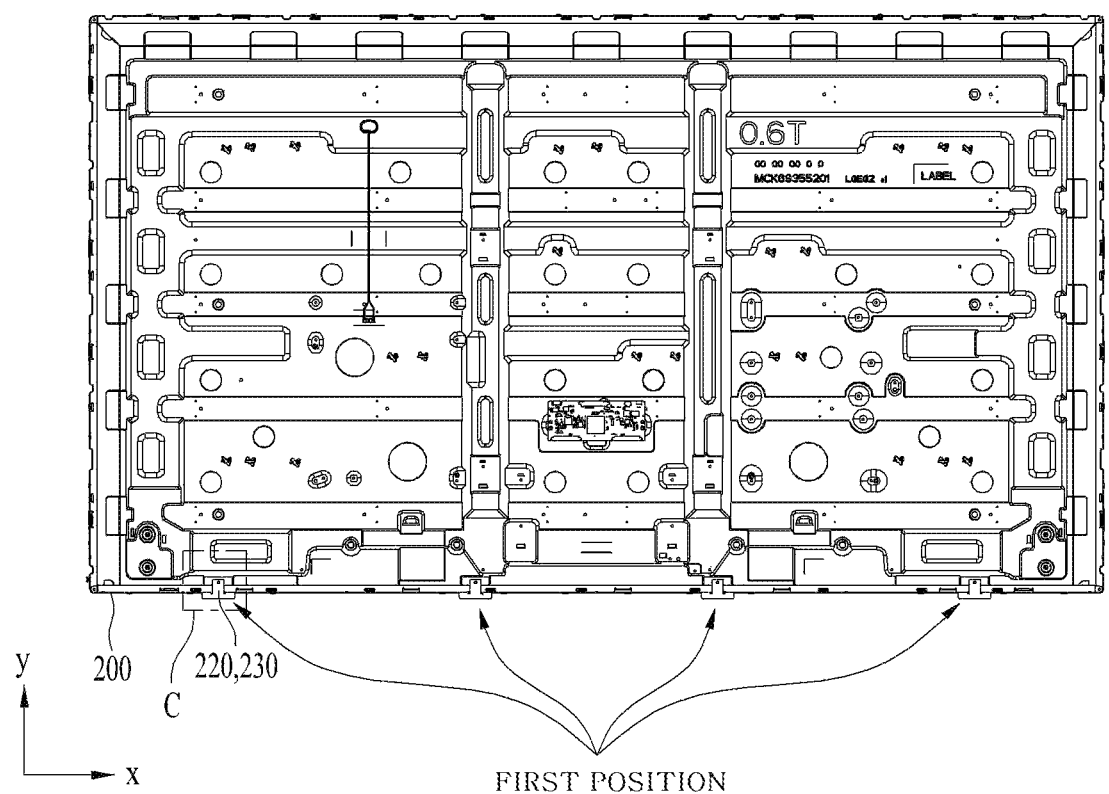
FIG. 12 is a rear view of the middle frame according to the present invention.
Figure 13:
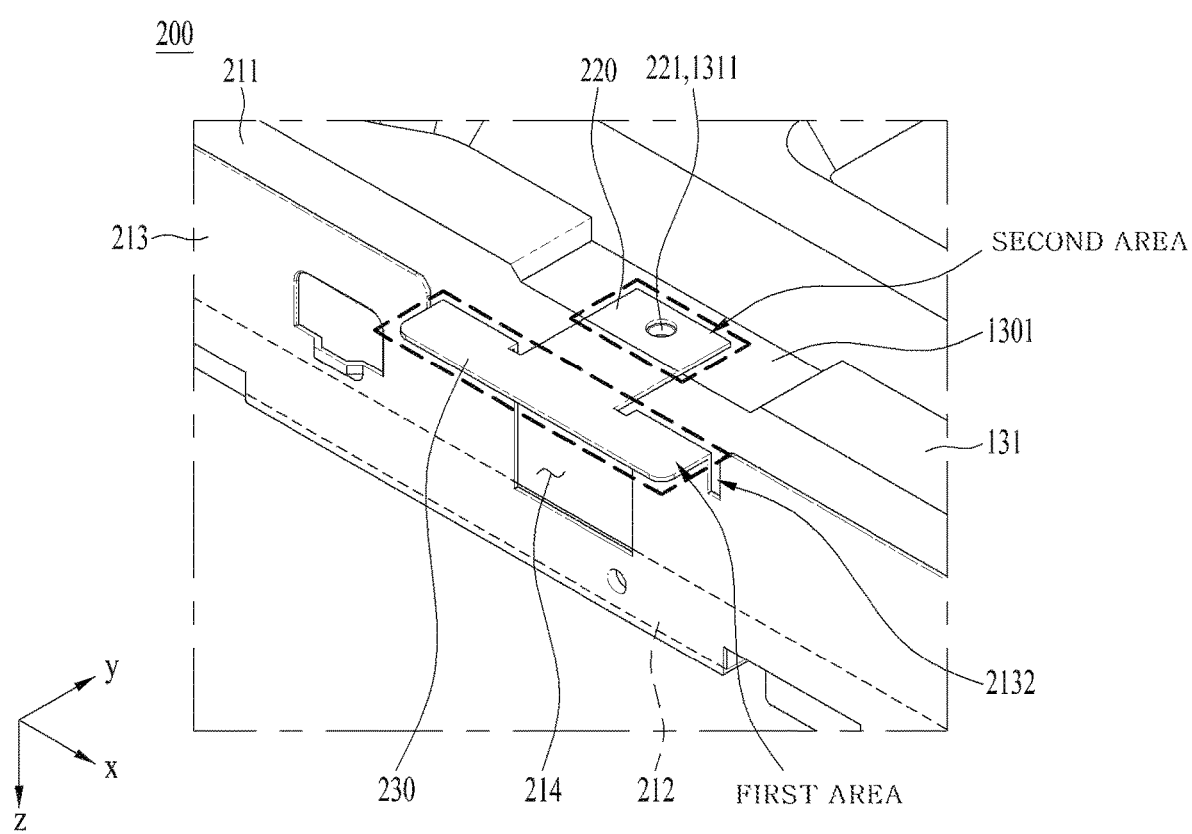
FIG. 13 is a perspective view of area C of FIG. 12.
Figure 14:
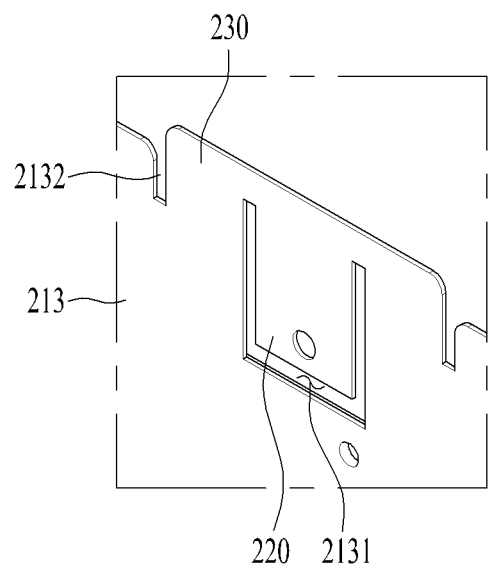
FIG. 14 is a view illustrating a partial area of a fixing bracket and an expansion bracket before bending.

FIG. 12 is a rear view of the middle frame 310 according to the present invention, FIG. 13 is a perspective view of area C of FIG. 12, and FIG. 14 is a view of a partial area of a fixing bracket 220 and an expansion bracket 230 before bending.

The support portion 200 includes an inner sidewall 211, a flange 212, an outer sidewall 213, and the fixing bracket 220. In addition, the support portion 220 may include the expansion bracket 230, a boundary slit 2131, and a first slit 2132.

The support portion 220 may be distinguished from the middle-frame rear-surface portion 131 after a bending process is completed. That is, one side edge area of the middle frame 130 is bent to form the support portion 200, and the remaining area forms the middle-frame rear-surface portion 131.

The support portion 200, which includes the aforementioned components, may constitute the middle frame 130.

For convenience of description, the direction that the display output surface of the display device 100 faces is defined as the front direction, and the opposite direction is defined as the rear direction.

The inner sidewall 211 of the support portion 200 extends forward from the edge of the middle-frame rear-surface portion 131. The flange 212 extends outward from the front end of the inner sidewall 211, and the outer sidewall 213 extends rearward from the outer end of the flange 212.

That is, the cross section of the support portion 200 including the inner sidewall 211, the flange 212, and the outer sidewall 213 may have a "⊏"-shaped form.

The fixing bracket 220 extends from a first position on the rear end of the outer sidewall 213. The fixing bracket 220 is bent inward to support a second area of the middle-frame rear-surface portion 131. At this time, the fixing bracket 220 and the outer sidewall 213 may be perpendicular to each other.

The fixing bracket 220 is integrally formed with the middle frame 130 from a single material. That is, the fixing bracket may be manufactured in a molding step, unlike a conventional method in which a bracket is formed separately from the middle frame 130 and is then fixed thereto.

The middle frame 130 is integrally formed using a mold so as to include the inner sidewall 211, the flange 212, the outer sidewall 213, the fixing bracket 220 before bending, and the expansion bracket 230, which will be described below.

The fixing bracket 220 may be bent at the boundary with the outer sidewall 213, and may be supported by the middle-frame rear-surface portion 131. At this time, the middle-frame rear-surface portion 131 may form a stepped surface 1301 in order to form the surface for bonding with the fixing bracket 220.

The boundary slit 2131 divides the fixing bracket 220 before bending from the outer sidewall 213 of the support portion 200.

A portion of the outer sidewall 213 inside the boundary slit 2131 may form an opening 214 after the fixing bracket 220 is bent. Thus, the opening 214 corresponds to the shape of the fixing bracket 220.

The expansion bracket 230 further protrudes from the rear boundary of the outer sidewall 213 so as to connect the outer sidewall 213 and the fixing bracket 220 to each other.

The expansion bracket 230 is formed over a first area having a width and length sufficient to stably fix the outer sidewall 213 and the fixing bracket 220 to each other. The fixing bracket 220 and the expansion bracket 230 may be in the same plane regardless of whether or not bending is performed.

The fixing bracket 220 is bent and is supported by a second area of the rear surface of the middle frame 130 described above.

The first slit 2132 may be formed in opposite boundaries of the first area of the outer sidewall 213, which are extensions of opposite boundaries of the expansion bracket 230.

The first slit 2132 may minimize the generation of shear stress in the outer sidewall 213 upon bending of the expansion bracket 230, and may provide sufficient elasticity to allow the expansion bracket 230 to move to a predetermined extent in the planar direction of the expansion bracket 230 after bending, thereby preventing a fixing bracket fastening hole 221 and a middle frame fastening hole 1311 from deviating from each other due to manufacturing tolerances.

Figure 15:
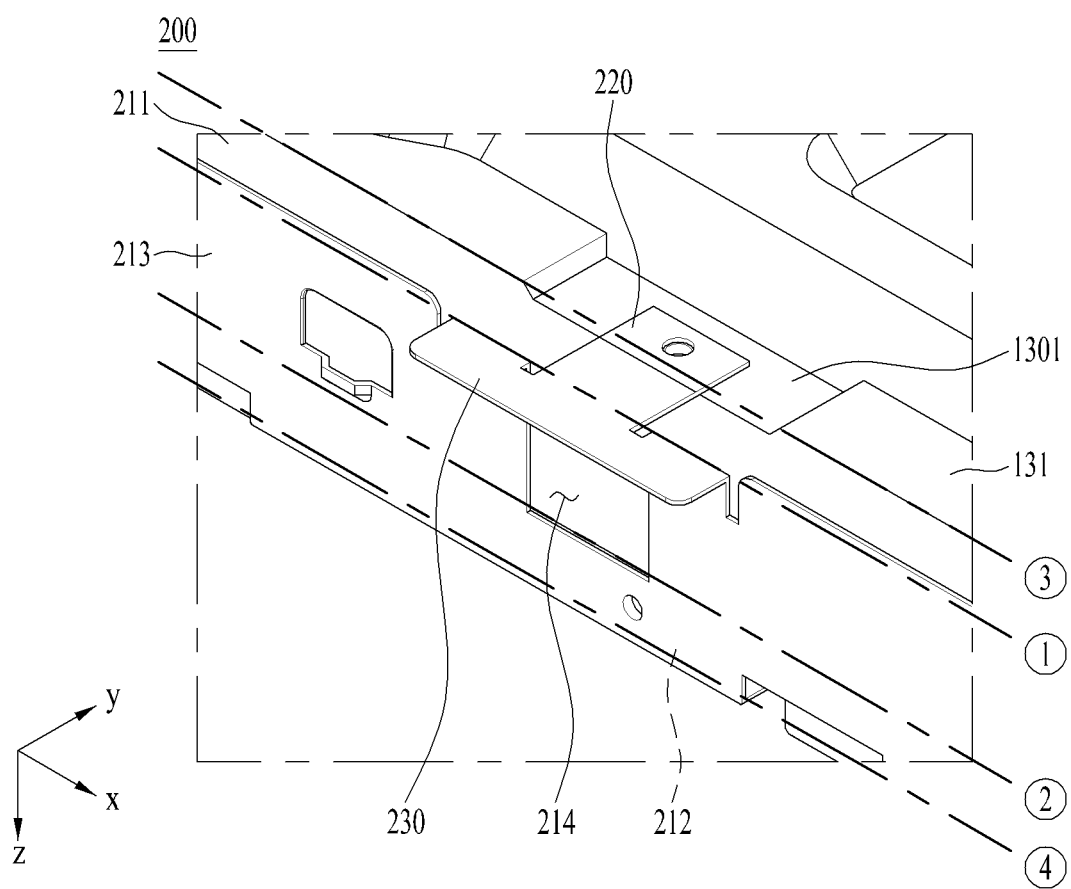
FIG. 15 is a view for explaining a process of forming the middle frame of the display device according to the present invention.

FIG. 15 is a view for explaining a process of forming the middle frame 130 of the display device 100 according to the present invention.

The outer boundary of the middle frame 130 including the shape of the expansion bracket 230 is formed. Upon the formation of the boundary of the middle frame 130, the first slit 2132 may also be formed. Subsequently, to obtain the shape of the fixing bracket 220, the boundary slit 2131, which divides the outer sidewall 213 from the fixing bracket 220 or the fixing bracket 220 from the expansion bracket 230, may be formed (see FIG. 14).

The formation of the boundary and the slit of the middle frame 130 may be implemented via notching and piercing processes. The notching process and the piercing process may be included in a first bending process to a fourth bending process, which will be described below.

First bending is performed about a boundary O1 between the expansion bracket 230 and the outer sidewall 213. With this first bending, the expansion bracket 230 and the outer sidewall 213 may be formed perpendicular to each other.

In other words, the fixing bracket 220 and the outer sidewall 213 are subjected to first bending about the boundary O1 therebetween.

Subsequently, second bending is performed about a boundary O2 between the flange 212 and the inner sidewall 211. With this second bending, the flange 212 and the inner sidewall 211 may be formed perpendicular to each other.

Subsequently, third bending is performed about a boundary O3 between the inner sidewall 211 and the middle-frame rear-surface portion 131. With this third bending, the inner sidewall 211 and the middle-frame rear-surface portion 131 may be formed perpendicular to each other.

Subsequently, fourth bending is performed about a boundary O4 between the flange 212 and the outer sidewall 213. With this fourth bending, the flange 212 and the outer sidewall 213 may be formed perpendicular to each other.

With the bending sequence of first bending to fourth bending, the fixing bracket 220 may be seated on the middle-frame rear-surface portion without interference from the inner sidewall 211.

In some cases, the bending sequence may be changed. Although first bending to fourth bending may be performed in any of various other sequences, first bending should not be performed after second bending and fourth bending are performed. This is because the fixing bracket 220 may interfere with the inner sidewall 211 when first bending is performed after both second bending and fourth bending are performed.

With the shape and process described above, the inner sidewall 211, the flange 212, the outer sidewall 213, and the fixing bracket 220 may form a "⊏"-shaped cross section without an additional member, and the fixing bracket 220 may be formed in the same plane as a middle frame rear surface 230a.

A bead process and a forming process may be added before the first bending process. The bead process and the forming process are to give a curved shape to the middle frame 130. Thereby, at least one area may be formed so as to be in contact with inner components and the like, which increases the overall rigidity of the display device 100.

Thereafter, a process of coupling the fixing bracket 220 and the middle-frame rear-surface portion 131 to each other may be added. Hereinafter, examples related to the coupling of the fixing bracket 220 and the middle-frame rear-surface portion 131 will be described.

When the fixing bracket 220 is bent to support the second area of the middle-frame rear-surface portion 131, such a bending structure may provide elastic fixing, and thus there is a need for an additional structure for fixing the fixing bracket 220 and the middle-frame rear-surface portion 131, in order to ensure fixing reliability.

As a first example, fixing may be performed in a compression-molding process.

The fixing bracket 220 and the second area of the middle-frame rear-surface portion 131 may be fixed to each other via a compression-molding process. Since the compression-molding process may be included in the fourth bending process in consideration of the existing process of manufacturing the middle frame 130, the compression-molding process may realize the fixing form described above without a separate process.

As a second example, screwing may be performed.

The fixing bracket 220 and the second area of the middle-frame rear-surface portion 131 may be provided with respective fastening holes therein, and screws may be coupled into the fastening holes so that the fixing bracket 220 and the middle-frame rear-surface portion 131 are fastened to each other.

Compared to the fastening of the conventional reinforcement bracket 320, this screwing uses a smaller number of screws and requires a smaller bonding surface area for fixing, thus achieving an improvement.

As a third example, soldering may be performed. Fixing via soldering is possible along the boundary between the fixing bracket 220 and the middle-frame rear-surface portion 131 supporting the fixing bracket 220.

The above-described three fixing methods may be used independently of each other, or all may be applied as needed, in order to further increase fixing reliability.

However, in terms of a reduction in the number of additional processes and manufacturing costs, compression molding and screwing may be selected.

MODE FOR INVENTION

It will be clear to those skilled in the art that the present invention may be embodied in other particular forms without departing from the spirit and essential features of the present invention.

The above detailed description should not be construed as limited in all aspects, but should be considered as exemplary. Accordingly, the scope of the present invention should be determined by the reasonable interpretation of the accompanying claims, and all changes that fall within the range equivalent to the present invention should be understood as belonging to the scope of the present invention.

INDUSTRIAL APPLICABILITY

As described above, a part or the entirety of features of the present invention may be applied to a display device or a manufacturing method thereof.

The invention claimed is:

1. A display device comprising;
   a display panel;
   a middle frame comprising a rear-surface portion located in a rear of the display panel and a support portion configured to form a sidewall on one side edge of the rear-surface portion;
   a guide panel coupled to the middle frame so as to surround an outer periphery of a side surface of the middle frame;
   a seating portion provided on the guide panel so as to form a portion of a side surface of the guide panel and surround the support portion;
   a source PCB seated on an outer surface of the seating portion;
   a member layer configured to connect one side of the display panel and the source PCB to each other; and
   a top case configured to cover the seating portion and the side surface of the guide panel and to, along with the source PCB, define a space.

2. The display device according to claim 1, wherein outer surfaces of the support portion and the seating portion are formed perpendicular to the display panel.

3. The display device according to claim 1, wherein the guide panel further comprises a rib formed on the outer surface of the seating portion so that one side edge of the source PCB is seated on the rib.

4. The display device according to claim 1, further comprising a heat dissipation pad having one surface in contact with a portion of an inner surface of the top case and a remaining surface in contact with a portion of an outer surface of the member layer.

5. The display device according to claim 1, wherein the support portion comprises:
   an inner sidewall configured to extend forward from the one side edge of the middle-frame rear-surface portion;
   a flange configured to extend outward from a front end of the inner sidewall;
   an outer sidewall configured to extend rearward from an outer end of the flange; and
   a fixing bracket configured to extend from a first position on a rear end of the outer sidewall and to be bent inward so as to be supported by a second area of the middle-frame rear-surface portion.

6. The display device according to claim 1, wherein the middle frame is integrally formed from a single material.

7. The display device according to claim 1, wherein a fixing bracket and a second area of the middle-frame rear-surface portion are fixed by a compression molding process.

8. The display device according to claim 7, wherein the compression molding process comprises a punching process having formed fastening holes in the fixing bracket and the second area of the middle-frame rear-surface portion.

9. The display device according to claim 8, further comprising a screw coupled into the fastening holes so as to fasten the fixing bracket and the middle-frame rear-surface portion to each other.

10. The display device according to claim 1, further comprising an opening formed at a position of an outer sidewall in an area corresponding to a shape of a fixing bracket.

11. The display device according to claim 1, further comprising an expansion bracket configured to extend outward from a first area comprising a position on a rear end of an outer sidewall of the support portion so as to connect a fixing bracket and the outer sidewall to each other.

12. The display device according to claim 11, further comprising:
   first slits formed in opposite boundaries of the first area on the rear end of the outer sidewall; and
   a boundary slit formed in a boundary between the fixing bracket and the outer sidewall.

13. The display device according to claim 11, wherein the fixing bracket and the expansion bracket are located in the same plane.

14. The display device according to claim 1, wherein a fixing bracket and an outer sidewall of the support portion are perpendicular to each other, a flange and an inner sidewall of the support portion are perpendicular to each other, the inner sidewall and the middle frame are perpendicular to each other, and the flange and the outer sidewall are perpendicular to each other.

* * * * *